United States Patent
Begley et al.

(10) Patent No.: US 6,492,705 B1
(45) Date of Patent: *Dec. 10, 2002

(54) INTEGRATED CIRCUIT AIR BRIDGE STRUCTURES AND METHODS OF FABRICATING SAME

(75) Inventors: Patrick A. Begley, W. Melbourne, FL (US); William R. Young, Palm Bay, FL (US); Anthony L. Rivoli, Palm Bay, FL (US); Jose Avelino Delgado, Valkaria, FL (US); Stephen J. Gaul, Merrimack, NH (US)

(73) Assignee: Intersil Corporation, Palm Bay, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1069 days.

(21) Appl. No.: 08/658,010

(22) Filed: Jun. 4, 1996

(51) Int. Cl.[7] .............................................. H01L 29/00
(52) U.S. Cl. ...................................... 257/522; 257/531
(58) Field of Search ................................. 257/522, 531, 257/754, 758, 776, 277, 506, 516

(56) References Cited

U.S. PATENT DOCUMENTS

| | | | |
|---|---|---|---|
| 3,786,560 A | * 1/1974 | Cunningham | 29/577 |
| 5,095,357 A | * 3/1992 | Andoh et al. | 357/55 |
| 5,227,658 A | * 7/1993 | Bayer et al. | 257/522 |
| 5,320,975 A | * 6/1994 | Cederbaum et al. | 437/44 |
| 5,413,952 A | * 5/1995 | Pages et al. | 437/62 |
| 5,413,962 A | 5/1995 | Lur et al. | |
| 5,450,263 A | * 9/1995 | Desaigoudar et al. | 360/110 |
| 5,539,241 A | * 7/1996 | Abidi et al. | 257/531 |

FOREIGN PATENT DOCUMENTS

| | | |
|---|---|---|
| EP | 0043014 A | 6/1982 |
| EP | 0076835 A | 4/1983 |
| EP | 0523450 A | 1/1993 |
| WO | WO 9417558 A | 4/1994 |

OTHER PUBLICATIONS

IEDM, 1986, pp. 184–187, XP002039418, S. Sugiyama, et al.: "Micro–diaphragm Pressure Sensor", p. 184, col. 2, line 37—p. 185, line 32; figure 3.
European Patent Search, Ser. No. 97108480.1.

* cited by examiner

Primary Examiner—Olik Chaudhuri
Assistant Examiner—Douglas A. Wille
(74) Attorney, Agent, or Firm—Thomas R. FitzGerald

(57) ABSTRACT

Airbridge structures and processes for making air bridge structures and integrated circuits are disclosed. One airbridge structure has metal conductors 24 encased in a sheath of dielectric material 249. The conductors extend across a cavity 244 and a semiconductor substrate 238. In one embodiment, the conductors traversing the cavity 244 are supported by posts 248 that extend from the substrate. In another embodiment, oxide posts 258 extend from the substrate to support the conductors.

In another embodiment, trenches 101 are made in a device substrate 110 bonded to a handle substrate 100. The trenches are filled with a dielectric and a conductor pattern is formed over the filled trenches. The substrate material between the conductors is then removed to leave a pattern of posts 116, 114, 112 that included dielectrically encased conductors 106.

In another bonded wafer embodiment, conductors 204 are encased in a dielectric above a sacrificial device region. The device region is isolated by suitably filled trenches. Vias 224, 226 in the dielectric 205 allow removal of the substrate material to form a cavity 208 beneath the conductors 204.

Other embodiments included a conductor 42 encased in dielectric that is formed above a region from which sacrificial polysilicon is removed to form a cavity 66. It is still another embodiment the conductor 42 is enclosed in a dielectric above a cavity 66a from which device material is removed.

20 Claims, 8 Drawing Sheets

FIG. 9B    FIG. 9C

INTEGRATED CIRCUIT AIR BRIDGE STRUCTURES AND METHODS OF FABRICATING SAME

FIELD OF THE INVENTION

The present invention relates to integrated circuit air bridge structures and methods of fabricating such structures which facilitate the formation of the integrated circuits and components thereof at the substrate level. The invention is especially suitable for use in providing integrated circuits which are hermetically sealed so as to protect the integrated circuits and any components, such as interconnecting conductors air bridges, inductors or capacitors, against damage or contamination from outside the device.

BACKGROUND OF THE INVENTION

In order to reduce interconnect capacitances in high performance and high frequency processes, air bridges are often used. A typical air bridge is formed using a second layer of interconnect metal deposited and patterned over a sacrificial material. The sacrificial material is later removed to leave a metal lead surrounded by air rather than a dielectric, such as oxide. The capacitances to the substrate and to other metal lead is thus reduced since air has a lower dielectric constant than do solid insulators such as silicon dioxide or silicon nitride.

However, traditional air bridge manufacturing techniques and structures have several disadvantages. The length of an air bridge is often limited by flexure of metal between two vias. So, relatively long air bridges can only be manufactured by stitching together multiple lengths of short air bridges. Another problem is that circuits fabricated with air bridges cannot be passivated. In a normal process, a passivation layer is deposited on top of an integrated circuit. Typical passivation layers are silicon oxide or silicon nitride. However, for air bridge structures, the passivation layer has to be omitted otherwise the passivation layer will fill the air under the bridge and thereby increase the capacitance of the air bridge or damage the bridge itself.

Accordingly, there has arisen a need for air bridges that can be made of longer lengths of metal than are available in air bridges of the prior art and also for air bridges that can be incorporated into integrated circuits where such circuits have a passivation layer.

SUMMARY OF THE INVENTION

It is the principal object of the present invention to provide improved integrated circuit air bridge structures which may be fabricated at the substrate level and which are passivated in the course of fabrication thereby avoiding the need for ceramic packaging or encapsulation, as well as to methods for fabrication of such structures.

It is a still further object of the present invention to provide improved integrated circuit air bridge structures which may be fabricated at the substrate level without materially increasing the volume occupied by the integrated circuit and any components.

It is a still further object of the present invention to provide improved integrated circuit air bridge structures having air bridges or other components made out of conductive elements (e.g., inductors or capacitors), wherein sufficient spacing is provided between the air bridges of the components and the active integrated circuit so as to reduce the effect of parasitic capacitance between the conductive elements and the circuits and adversely affecting the high frequency response of these circuits, as well as to methods of fabricating such structures.

The invention may attain one or more, but not necessarily all, of the foregoing objects.

Briefly described, an integrated circuit structure in accordance with the invention provides an air bridge fabricated on the same die as the integrated circuit to which the air bridge is connected.

The invention provides an on-silicon air bridge that is compatible with single substrate and bonded substrate structures. The invention provides an air bridge structure on a semiconductor substrate or a device substrate. The device or semiconductor substrate may have one or more integrated circuits or semiconductor devices formed therein. The air bridge structure comprises an elongated metal conductor that is encased in a dielectric sheath. At least a portion of the sheath is exposed to ambient atmosphere. In one embodiment, the entire sheath is exposed to atmosphere. However, other embodiments expose a substantial portion of the sheath to ambient atmosphere in order to reduce the dielectric coupling between the sheath and the semiconductor substrate. In a typical construction, the encased conductor crosses a cavity in the substrate. The encased conductor is supported in its transit across the cavity by posts that extend from the lower surface of the cavity. The support posts comprise dielectric material, substrate material, or both.

In its broader aspects, the air bridge structure is made by forming a dielectric layer over semiconductor substrate. Next, an elongated conductor is formed over the dielectric layer and is encased in dielectric material. Then, portions of the substrate or the dielectric layer, or both, are removed to expose the encased elongated conductor to air. The method contemplates using sacrificial materials located between the encased conductor in the substrate. Removing the sacrificial material forms an air bridge cavity. The methods of the invention also include removing portions of the substrate in order to form the air bridge cavity.

Particular embodiments of the invention include a cavity formed in the substrate and/or in the dielectric layer on the substrate. The encased conductors extend across the cavity and enter and exit the dielectric layer overlying the cavity.

The invention may also be used with bonded substrates. In a bonded substrate structure, a device substrate is bonded to a handle substrate, typically with an oxide bonding layer. An air bridge structure is formed in the device substrate in several ways. Those skilled in the art will appreciate that trench isolation is a common step used in the formation of devices and bonded substrates. The air bridge of the invention is compatible with the trench forming steps that are typically used in bonded substrates. In one bonded substrate embodiment, trenches are formed down to the oxide bonding layer. The trenches are coated with a dielectric, filled, and planarized. The dielectric layer covers the planarized trenches and elongated conductors are patterned on the dielectric layer over the air bridge trenches. Another dielectric layer covers the patterned conductors in order to encase them in a dielectric. Then the substrate is further patterned and etched to remove material from between the filled air bridge trenches. The final structure provides air bridge conductors encased in a dielectric that is spaced from the bonding oxide layer.

Bonded substrate structures are used to form inductors. In one embodiment, elongated conductors are encased in a dielectric layer that is disposed over a device substrate region located between isolating trenches. Vias are opened in the dielectric layer and substrate material is removed to form an air bridge cavity beneath the encased conductors. Two air bridge cavities may be formed near one another and separated by a third cavity. Over each air bridge cavity conductors are patterned in a continuous, spiral path of metal in order to form an inductors. The third cavity is filled with ferromagnetic material.

Two further embodiments of the invention use a sacrificial layer for forming a cavity beneath an elongated, encased conductor. In one embodiment, a sacrificial layer of polysilicon is formed over a first dielectric layer that is on the semiconductor substrate. An encased conductor is formed over the sacrificial layer. Vias are opened to the sacrificial polysilicon and the polysilicon is removed to leave an air bridge cavity beneath the encased conductor and between the encased conductor and the silicon substrate. In an alternate embodiment, the dielectric layer on the surface of the substrate is partially removed before the sacrificial polysilicon is deposited. The sacrificial polysilicon is removed along with portions of the underlying substrate. The latter provides an enlarged air bridge cavity beneath the encased conductor.

The foregoing and other objects, features and advantages of the invention as well as presently preferred embodiments thereof and the best known techniques for fabricating integrated circuit structures in accordance with the invention will become more apparent from a reading of the following description in connection with the accompanying drawings.

BRIEF DESCRIPTION OF DRAWINGS

FIGS. 9A–9C and 10A, 10B are fragmentary views, the view in FIGS. 9C being taken along the line 9C—9C in FIG. 9B, the views illustrating means for support of conductive elements in the open space of an integrated circuit device;

DETAILED DESCRIPTION

Figure 1:
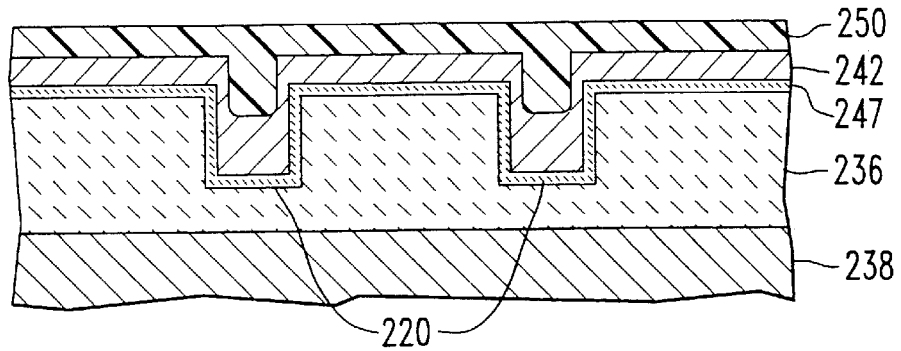
FIGS. 1–4 show the device illustrated in FIG. 5 in successive stages of the fabrication thereof.
Figure 2:
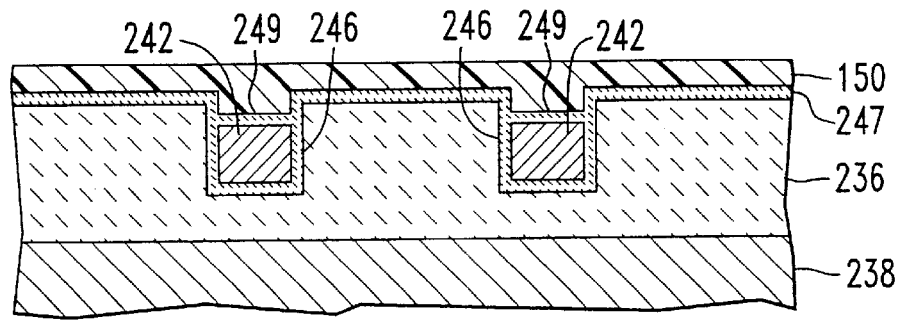
Figure 3:
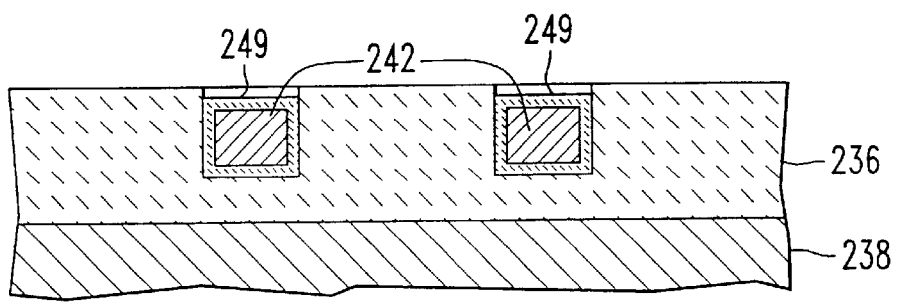
Figure 4:
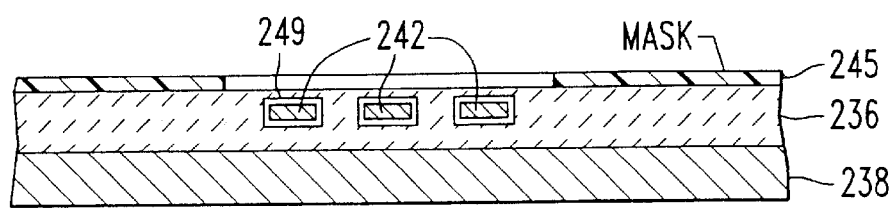
Figure 5:
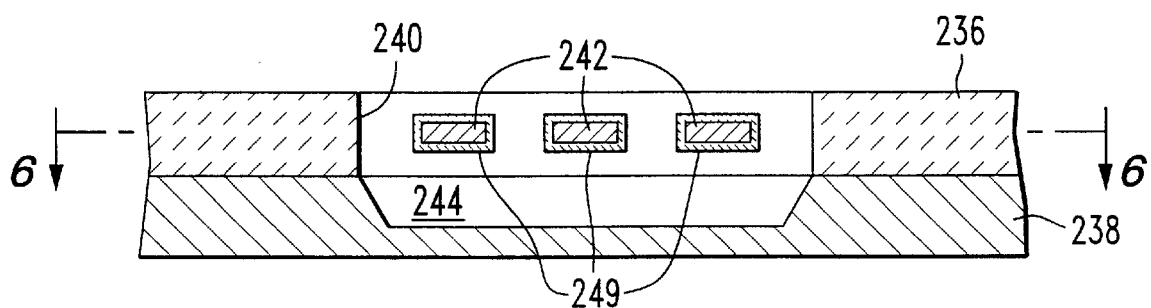
FIG. 5 is a sectional view of a portion of an integrated circuit device having conductive members disposed in so-called "air bridge" configuration over an open space within the device.
Figure 6:
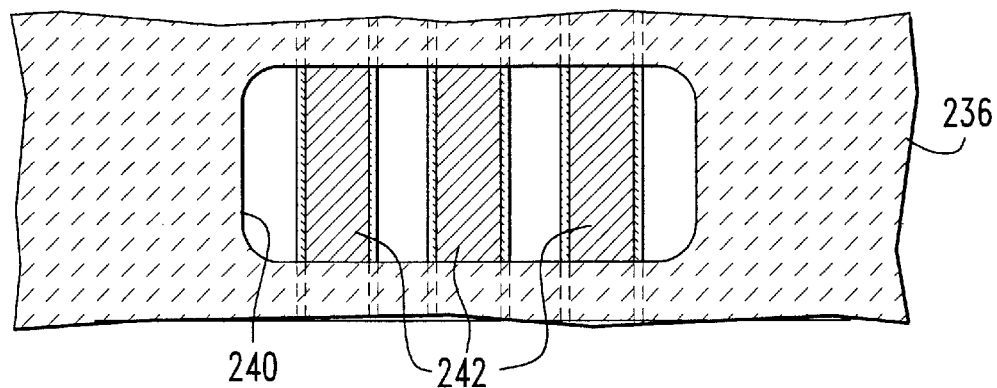
FIG. 6 is a fragmentary plan view illustrating the portion of the device shown in FIG. 5; the view being taken along the line 6—6 in FIG. 5.

The air bridge structure shown in FIGS. 5 and 6 is made in accordance with the process steps shown in FIGS. 1–4. A suitable silicon substrate 238 has a layer of silicon dioxide 236 deposited or grown on one surface. That surface is processed to form the air bridge structure of FIGS. 5 and 6.

By referring to FIGS. 1–4, the steps in the process of fabricating the devices of FIGS. 5 and 6 will become more apparent. First, trenches 220 are formed in an oxide layer 236 that covers substrate 238. The trenches 220 are coated with a layer of silicon nitride 247 or any other dielectric that can be selectively etched with respect to oxide layer 236. Next, a layer of metal 242 is deposited on the surface and in the trenches 220. The surface is then coated with a layer of photoresist 250. The photoresist and metal layer are planarized by a reactive ion etch that uses the nitride layer 247 as an etch stop. After the etch, the remaining photoresist is stripped and a second nitride layer is deposited to cover the metal in the trenches to form nitride sheaths 249 that surround the metal 242 in each trench. Another layer of photoresist 150 is deposited and patterned to protect the nitride layer 249. The exposed nitride on the surface is etched away leaving the sheath 249 around the conductors 242. The conductors 242 that remain may be partially imbedded in the insulative material layer 236 (the oxide) as shown in FIG. 4. As also shown in FIG. 4, the surface of the layer 236 may be masked with an etchant resistant mask 245 and then etched to form the cavity 240 and the cavity 244 as shown in FIG. 5.

Referring to FIGS. 5 and 6 there is shown structure having a layer 236 of insulating material, such as oxide, and a substrate layer 238 of semiconductive material, such as silicon, in which integrated circuits may be formed. Supported in the layer 236 and bridging an opening 240 therein are a plurality of conductors 242 which define air bridges for interconnecting integrated circuits (not shown) in the silicon substrate 238. A cavity 244 in the substrate 238 is disposed in alignment with the opening 240. The opening and cavity provide an air dielectric which reduces parasitic capacitance between the circuits in the silicon substrate 238 and the air bridge conductors 242. Sheaths 249 around the conductors 242 protect the conductors against contamination or damage by, for example, flakes of conductive material which may be formed during the processing of the substrate 238 to provide the integrated circuits therein.

Figure 7:
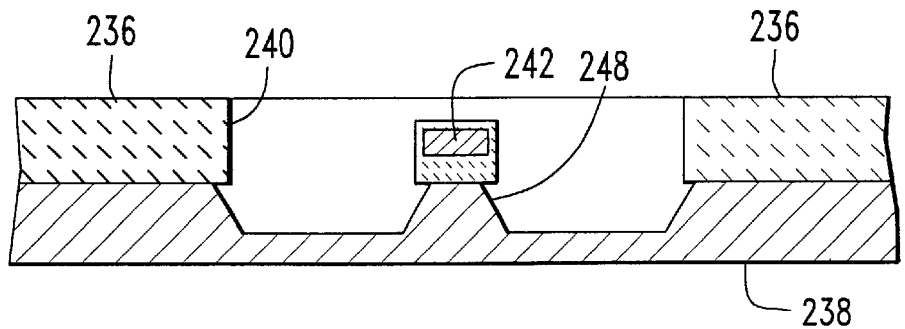
FIGS. 7 and 8 illustrate a device similar to that shown in FIG. 5.

Support posts 248 (FIG. 7) may be provided in the opening 240 and underlie the sheathed conductors 242. The support posts 248 provide added support for the conductors 242. A support post 248 may be aligned with the sheathed conductors 242. An anisotropic etch will remove silicon from areas not covered by the sheathed conductors to provide the supports 248 shown in FIG. 7.

Figure 8:
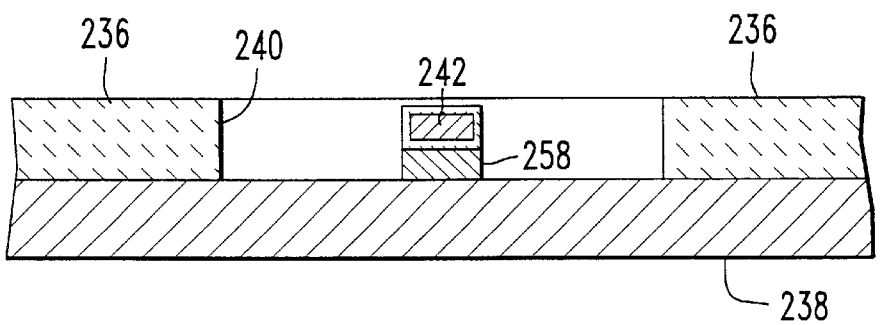
Figure 9A:
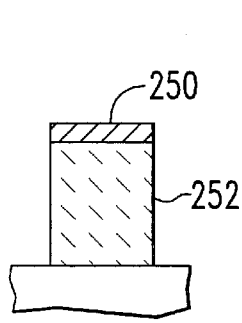
Figure 10A:
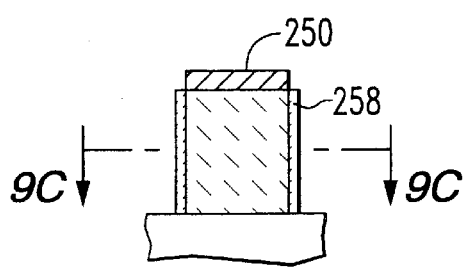
Figure 10A:
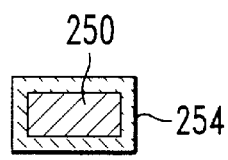
Figure 10B:
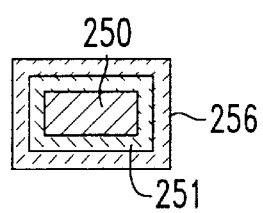

The support posts may also be formed only of the oxide layer 236. The posts are coated with a protective layer of nitride 258 as shown in FIG. 8. Referring to FIG. 9A an aluminum conductor 250 rests on oxide support post 252. The post is passivated by depositing a sheath of nitride 258 or other passivating material, as shown in FIGS. 9B and 9C. The conductor may be passivated by oxidation to provide a layer 254 of aluminum oxide ($Al_2O_3$) as shown in FIG. 10A. The metal conductor 242 or aluminum conductor 250 may be also be passivated by a sheath of silicon oxide 251 ($SiO_2$) covered by a sheath of polysilicon 256 (FIG. 10B), thus providing a dual layer sheath.

Figure 11:
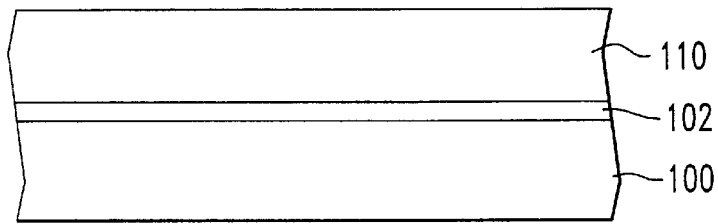
FIGS. 11–15 show progressive steps in the formation of a bonded substrate with an air bridge formed in the device substrate.
Figure 12:
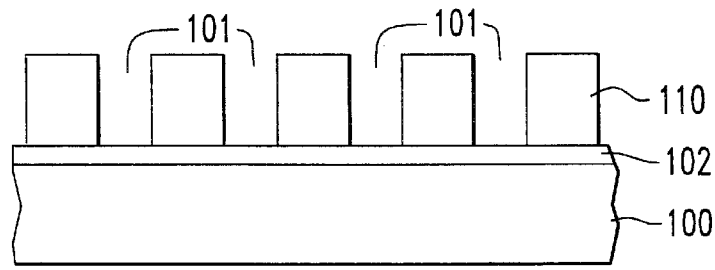
Figure 13:
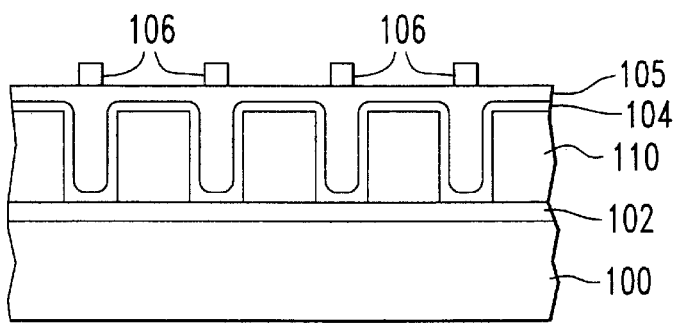
Figure 14:
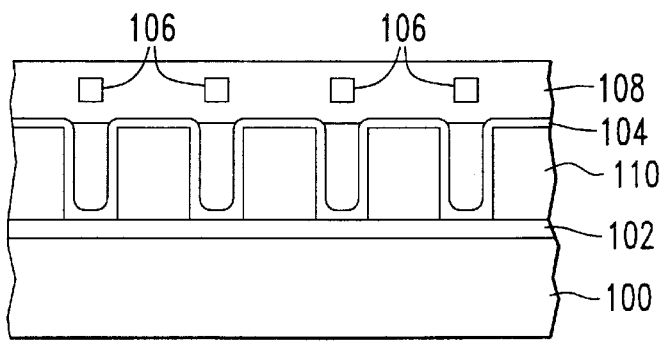
Figure 15:
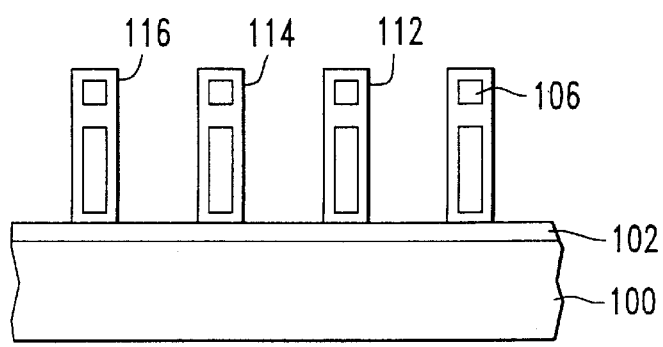

Turning to FIGS. 11–15, there is shown another embodiment of the invention formed on a bonded substrate structure. In FIG. 11 there is a handle substrate 100 that is oxide bonded via oxide layer 102 to the device substrate 110. In a following step (FIG. 12), the device substrate 110 is patterned to form a series of trenches 101 to the surface of the bond oxide layer 102. Next, (FIG. 13) an oxide layer 104 is either thermally grown or deposited over the surface of the device substrate and the trenches 101. The trenches 101 are filled with polysilicon 105 and planarized. Another layer of dielectric material 108, e.g., silicon dioxide, is deposited. A layer of metal 106 is deposited and etched to form the conductors 106 over trenches 101. Another oxide layer 108 covers the metal. The structure of FIG. 14 is then masked and etched to provide the separated posts 116, 114, 112 of FIG. 15. The air between the separated posts reduces the capacitance between the conductors 106. So, the air bridge structure formed by the process of FIGS. 11–15 uses trench techniques compatible with customary bonded substrate processing. The air bridge structure is thus formed at the level of the device substrate 110 and is readily interconnected with circuits in the device substrate 110 by customary metallization and interconnect techniques.

Figure 16:
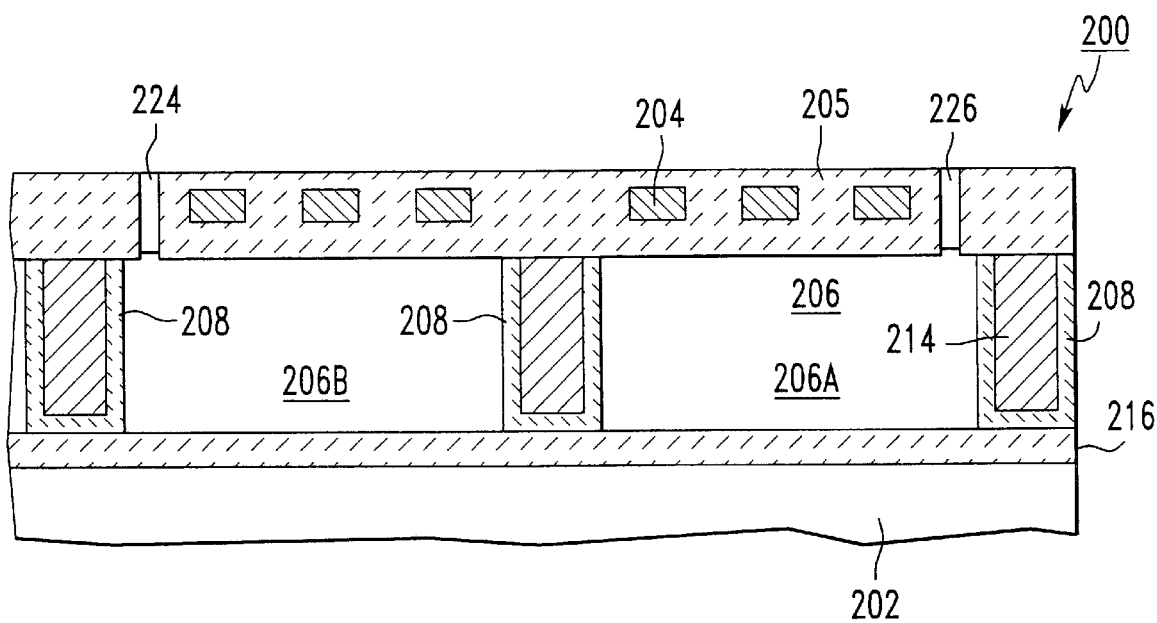
FIG. 16 is a fragmentary, sectional view of a portion of an enclosed, multi-layer integrated circuit device where a conductive member forming an inductor is located over an open space, all in accordance with still another embodiment of the invention, which provides contamination and damage protection and ease of handling during manufacture of integrated circuit devices, the view being taken along the line 16—16 in FIG. 17.
Figure 17:
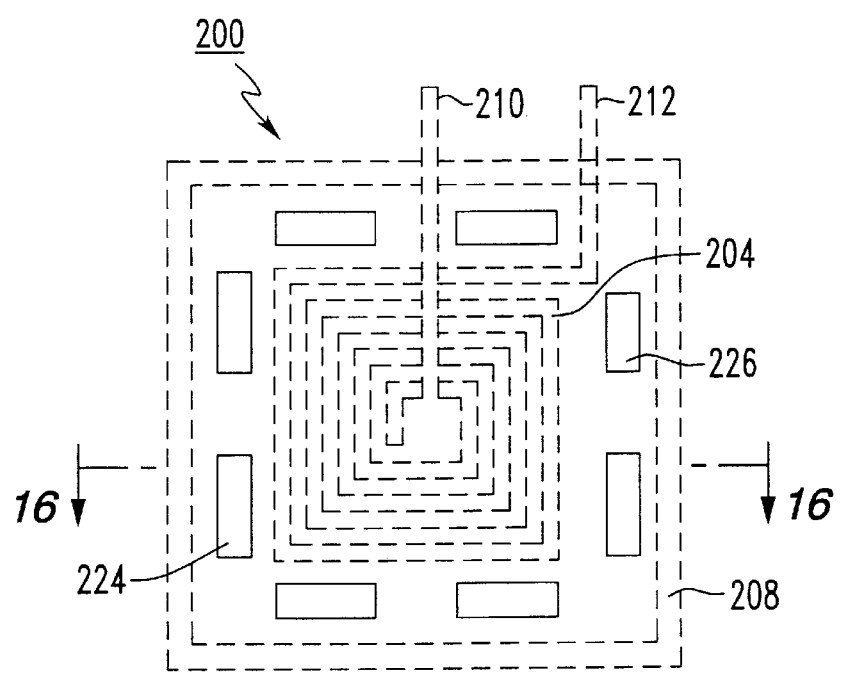
FIG. 17 is a plan view of the portion of the device shown in FIG. 16.

Referring to FIGS. 16 and 17 there is shown a device substrate 200 which is bonded to a handle substrate 202 via oxide bond layer 216. In device substrate 200 integrated circuits (not shown) and air bridge structure are formed. The device substrate contains an inductor coil 204 suspended over the interfacing surfaces 207 of the device substrate 200 and handle substrate 202 and separated therefrom by a space or void 206 which may be void except for posts 208.

The coil 204 provides the inductor and may be of the square spiral shape shown in FIG. 17. The center and end contacts 210 and 212 to the ends of the coil 204 do not appear in FIG. 16. These contacts are of metal just like the coil turns and may extend along posts 208 to the active integrated circuits in the device substrate 200 in a manner similar to connections from the coils and the embodiments of the invention heretofore described.

The coil 204 is an air bridge conductive element. The bridge end support for the element 204 is provided by a layer of dielectric material 205 having an extent beyond the outer periphery of the conductors of the coil 204. This bridge is also supported on the posts 208.

Device substrate 200 has a bottom oxide layer 216. Oxide layer 216 bonds the device substrate 200 to the handle substrate 202. Another trench in a center post 208 may be filled with polysilicon in which case a pair of voids 206A and 206B may be formed in the substrate 200.

Figure 18:
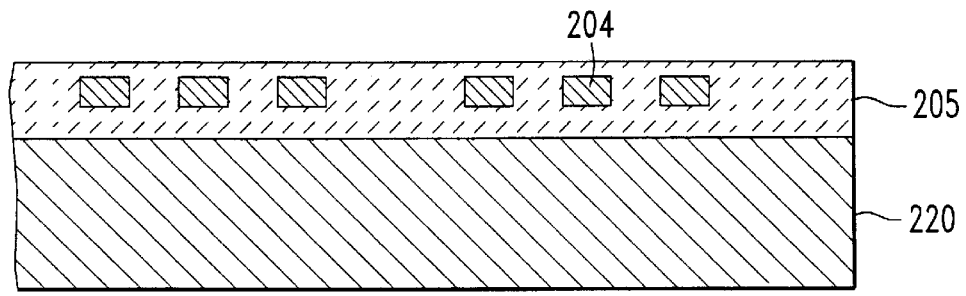
FIGS. 18 to 20 are sectional views illustrating the device shown in FIGS. 16 and 17 in successive stages of the manufacture thereof.
Figure 19:
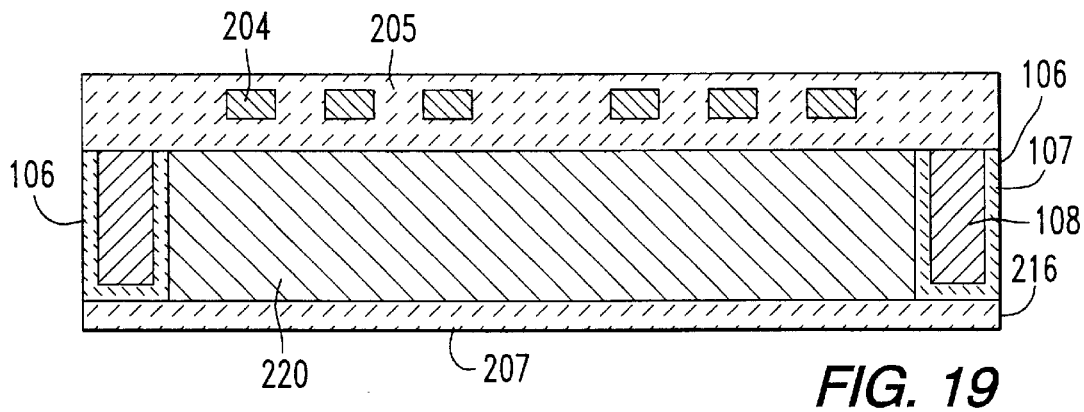
Figure 20:
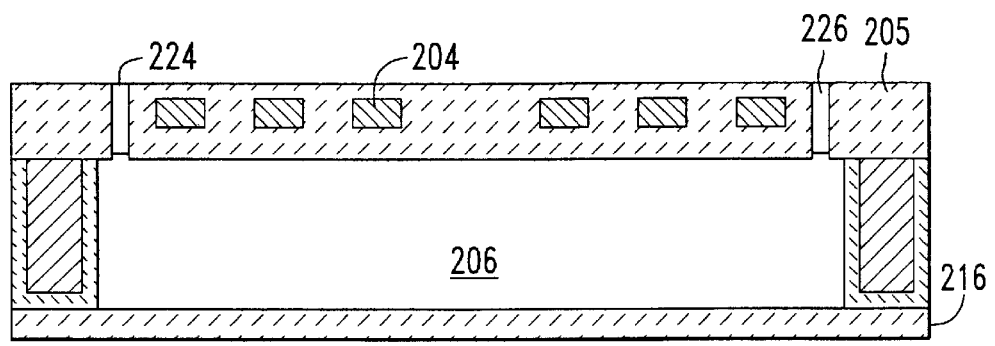

The device substrate 200 is fabricated in process steps shown in FIGS. 18, 19 and 20. A device substrate 200 has a silicon substrate 220 covered with a layer of oxide 205 or other suitable dielectric that encases conductor coil 204. The coil 204 may be provided in a trench and then covered so as to form the layer of dielectric, insulating material 205. As an alternative, the coil 204 may be formed by depositing a metal layer on a dielectric layer, patterning the metal layer, and depositing a further layer of dielectric on the patterned metal layer.

As shown in FIG. 19 the device substrate is patterned to form trenches 106. The trenches are opened, coated with a thermal oxide 107 and filled with undoped polysilicon 108. The bond layer 216 joins the handle substrate 202 (not shown) to the device substrate 220. As shown in FIG. 20 vias 224 and 226 are etched into the layer 205. The silicon of device substrate 220 is removed from the region between the trenches 106 by a selective etch to form the void 206.

Figure 21:
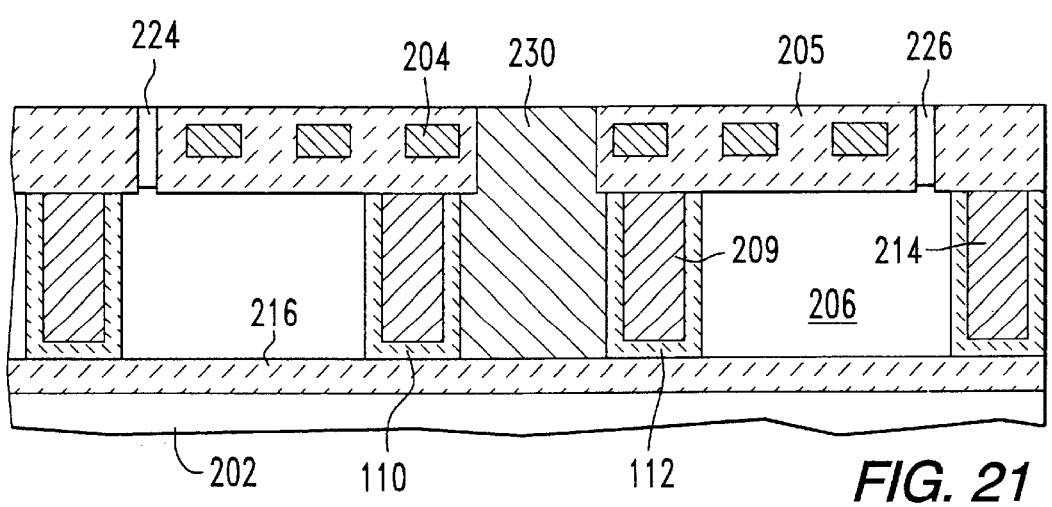
FIG. 21 is a sectional view of a device similar to that shown in FIG. 16 wherein an internal core of ferromagnetic material is provided within the device.

Referring to FIG. 21 there is shown a structure similar to that shown in FIG. 16 and like parts are indicated with like referenced numerals. A cylindrical post 230 is provided by forming a via in the layer 205 and removing silicon in a region between the trenches 110, 112. The cavity between trenches 110 and 112 is filled with a ferromagnetic material such as iron. The ferromagnetic post 230 extends into the area of the inductor coil 204 and is electromagnetically coupled thereto so as to enhance and increase the inductance of the coil.

Figure 22:
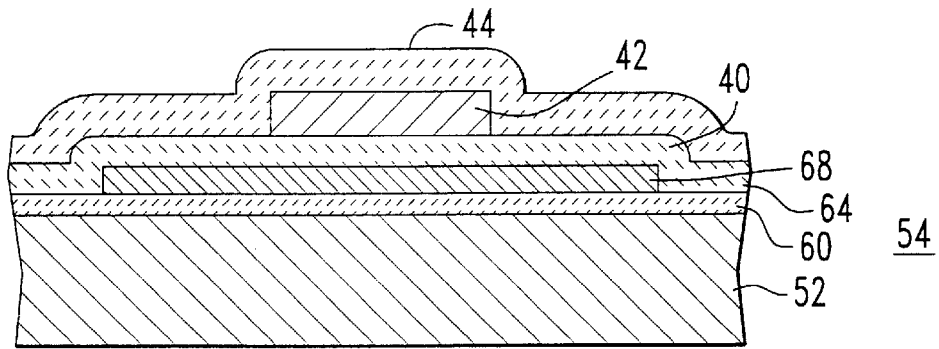
FIGS. 22 and 23 are sectional views of the device shown in FIG. 24 during an earlier and later stage in the fabrication thereof.
Figure 23:
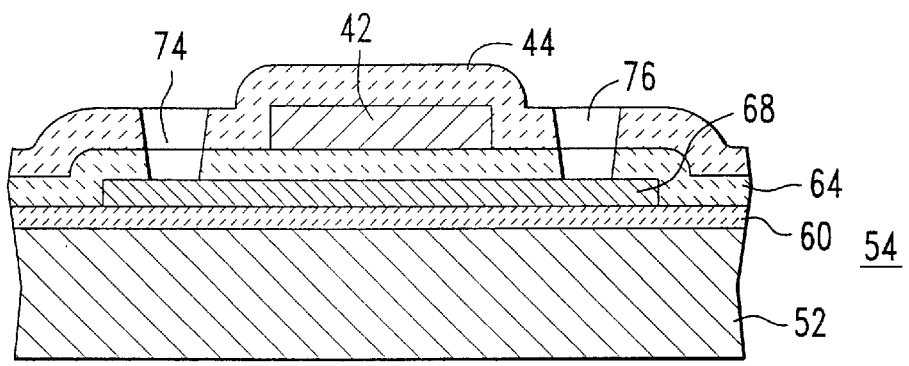
Figure 24:
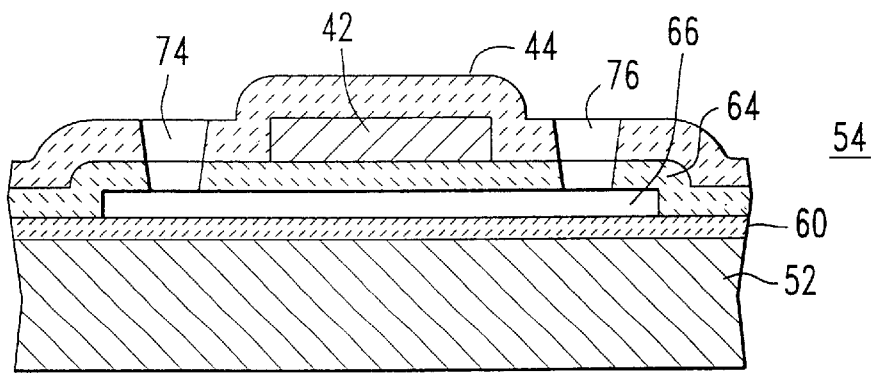
FIGS. 24 is a sectional view of a portion of an integrated circuit device of bonded layers including a conductive layer providing an interconnection suspended and bridging an open space in the device.
Figure 25:
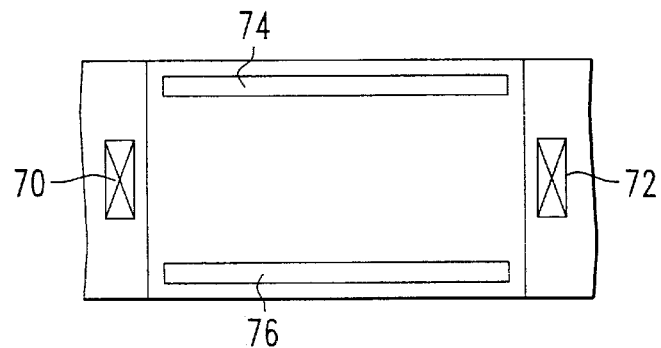
FIG. 25 is a fragmentary plan view of the portion of the device shown in FIG. 24.

An in-silicon air bridge as shown in FIG. 24 may be formed by the process steps shown in FIGS. 22 and 23. Referring to FIGS. 24 and 25, there is shown another integrated circuit structure 54 with an air bridge conductor 42. The air bridge 42 is formed on a single semiconductor (silicon) substrate layer 52 having an insulative ($SiO_2$) layer 60 thereon.

As shown in FIGS. 22 and 23, the active integrated circuits may be formed separately in the substrate 52 and have connections such as conductor 42 between devices of the integrated circuit. The silicon substrate 52 has an insulating layer 60, typically an oxide layer, either thermally grown or deposited. A sacrificial layer of polysilicon 68 or other material covers the insulating layer 60. The sacrificial layer 68 is patterned to the desired shape of an air bridge cavity and is covered with an oxide layer 64. A layer of metal 42 is deposited on oxide layer 64 and is patterned into the desired configuration of the air bridge conductor. The patterned conductor 42 is covered with an insulating layer 44 of oxide or nitride.

As shown in FIG. 23, vias 74 and 76 are opened to remove the sacrificial polysilicon layer 68. A cavity 66 is created by etching and removing the polysilicon 68. Further vias 70, 72 are provided to contact the airbridge metal 42 as shown in FIG. 25.

Figure 26:
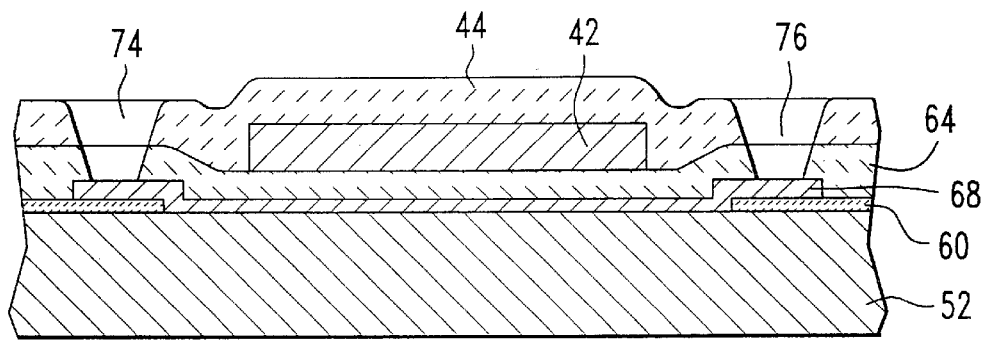
FIG. 26 is a sectional view of a portion of a bonded, enclosed, multi-layer device having a conductive layer which provides an interconnection over an open space in the device in accordance with another embodiment of the invention.
Figure 27:
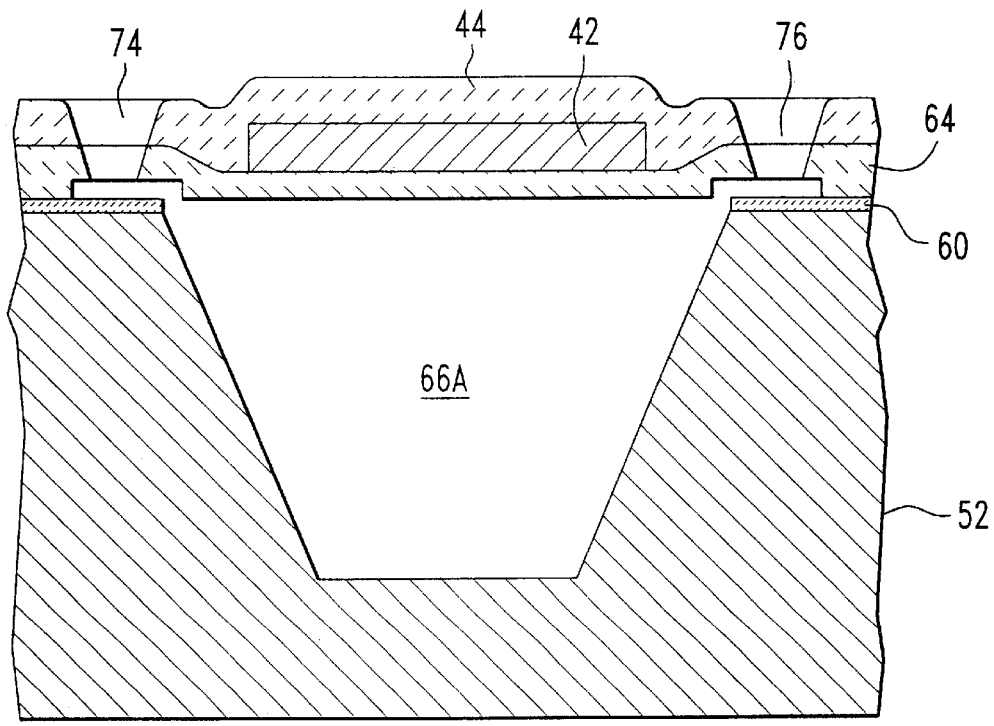
FIG. 27 is a sectional view of the device shown in FIG. 26 in a later stage of manufacture.

Referring to FIG. 27, there is shown a structure similar to that shown in FIG. 24 and like parts are labeled with like referenced numerals. Again, a layer of sacrificial polysilicon or metal, which is shown at 68 in FIG. 26, is used. First, the surface oxide layer 60 is patterned to remove a portion of oxide layer 60. A sacrificial polysilicon layer 68 is deposited over the exposed substrate. The polysilicon layer 68 is covered with an oxide layer 64, the air bridge metal 42 is deposited on the oxide layer 64 patterned and covered with another oxide layer 44. Etch windows 74 and 76 provide etch holes for an etchant, for example, KOH, which etches the polysilicon 68 isotropically, but etches the silicon in the substrate 52 anisotropically thereby producing a deep cavity 66A. The anisotropic etching process to produce the deep void or cavity 66A may be carried out in accordance with the etch/removal method described in an article by Sugiyama, et al., entitled "Micro-diaphragm Pressure Sensor," IEDM 1986, pages 184–187. The void space 66A is aligned with the conductive element of the air bridge structure 42 and is operative to reduce parasitic capacitances in the device. Removing silicon not only reduces capacitance but also reduces parasitic image current induced in the silicon by currents flowing in a conductor above the silicon. Such induced current is reduced by the voids that space the conductors from the silicon. The devices are fabricated at the substrate level and then separated into dice having one or more active integrated circuits using scribes or trenches of the type conventionally used for die separation.

From the foregoing description it will be apparent that there has been provided improved integrated circuit devices and methods of making the same, while several embodiments which obtain the features of the invention have been described, variations and modifications thereof within the scope of the invention, will undoubtedly become apparent to those skilled in the art. The foregoing description should be taken as illustrative and not in a limiting sense.

What is claimed is:

1. An air bridge structure in a semiconductor substrate having one or more integrated circuits or semiconductor devices therein comprising:

two or more elongated metal conductors each enclosed over at least a portion of its length by a dielectric coating, each dielectrically coated conductor being spaced from adjacent dielectrically coated conductors, said dielectric coating having an outer surface exposed to ambient atmosphere, and said dielectrically coated conductors being disposed in a plane substantially parallel to the semiconductor substrate and extending over a cavity in said substrate;

a support extending from a surface of said semiconductor substrate to said outer surface of said dielectric coating, said support operative to support at least one of said conductors; and wherein said support comprises a semiconductor material.

2. The air bridge structure of claim 1 wherein the dielectric coating comprises a dielectric selected from the group consisting of silicon dioxide, silicon nitride, and aluminum oxide.

3. The air bridge structure of claim 1 wherein the conductor comprises aluminum.

4. The air bridge structure of claim 1 wherein the support comprises a dielectric.

5. The air bridge structure of claim 1 wherein the entire outer surface area of a portion of the dielectric coating is exposed to ambient atmosphere.

6. The air bridge structure of claim 1 wherein about three quarters of entire outer surface area of a portion of the coating is exposed to ambient atmosphere.

7. The air bridge structure of claim 1 wherein a majority of the entire outer surface area of a portion of the coating is exposed to ambient atmosphere.

8. An air bridge structure comprising:

a substrate of semiconductor material comprising one or more semiconductor devices or integrated circuits and a layer of dielectric material on said substrate, said substrate having a cavity and said dielectric layer having an opening aligned with said cavity;

two or more conductors extending over the cavity, each conductor individually coated with a sheath of dielectric material, said conductors and said dielectric material disposed in a plane substantially parallel to the substrate, each conductor being within the plane of said dielectric material.

9. The air bridge structure of claim 8 wherein the conductors extend into the dielectric layer.

10. The air bridge structure of claim 8 further comprising a plurality of posts extending from the substrate wherein each coated conductor is individually supported by a post extending from the substrate to the sheath around the conductors.

11. The air bridge structure of claim 10 wherein the posts comprise semiconductor material.

12. The air bridge structure of claim 10 wherein the posts comprise dielectric material.

13. The air bridge structure of claim 8 wherein the conductors are sheathed in a dielectric selected from the group consisting of silicon dioxide, silicon nitride, and aluminum oxide.

14. An air bridge structure comprising:

a bonded substrate structure comprising a device substrate having an upper and lower surface with one or more semiconductor devices or integrated circuits formed in said device substrate, a handle substrate, and a bonding layer for bonding the lower surface of the device substrate to the handle substrate;

a cavity in said device substrate extending from the upper surface of the device substrate to the bonding layer:

two or more posts, each post comprising an elongated strip of dielectric material extending from the bonding layer to about the upper surface of the device substrate and disposed in a plane substantially transverse to the substrate;

a conductor corresponding to each post, each conductor encased in and being within the plane of said elongated strip of dielectric material.

15. The air bridge structure of claim 14 wherein the post further comprises an elongated region of polysilicon disposed between the conductor and the bonding layer.

16. An air bridge structure comprising:

a bonded substrate structure comprising a device substrate with upper and lower surfaces and with one or more semiconductor devices or integrated circuits formed therein, a handle substrate, and a bonding layer for bonding the lower surface of the device substrate to the handle substrate;

the device substrate comprising of semiconductor material and a first cavity having opposite walls extending between the upper surface and the bonding layer a layer of dielectric material lining the walls of the first cavity;

one or more conductors disposed in an air bridge dielectric layer, and extending over the first cavity.

17. The air bridge structure of claim 16 further comprising a second device substrate cavity spaced from the first cavity, the conductor comprising a spiral extending over both said device substrate cavities, and a core cavity disposed between the first and second cavities and filled with ferromagnetic material.

18. An air bridge structure comprising:

a substrate of semiconductor material with one or more semiconductor devices or integrated circuits formed therein;

one or more layers of dielectric material, disposed in a plane substantially parallel to the substrate on said substrate and said dielectric layers both supporting and encasing a conductor in the plane of said dielectric material;

a cavity in said dielectric layers, said cavity aligned with the dielectrically encased conductor and disposed over the substrate and between the encased conductor and the substrate.

19. The air bridge structure of claim 18 wherein the cavity comprises a cavity encased by said dielectric layers.

20. The air bridge structure of claim 16 wherein each cavity has a rectangular cross section.

* * * * *